United States Patent
Chen et al.

(10) Patent No.: US 6,938,505 B2
(45) Date of Patent: Sep. 6, 2005

(54) CHAMBER WAFER DETECTION

(75) Inventors: Kuen-Ei Chen, Tainan (TW); Yu-Yi Wu, Yungkang (TW); Chia-Hung Chung, Shanhua Jen (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 147 days.

(21) Appl. No.: 10/217,508

(22) Filed: Aug. 13, 2002

(65) Prior Publication Data
US 2004/0031338 A1 Feb. 19, 2004

(51) Int. Cl.[7] .............................................. G01N 19/00
(52) U.S. Cl. .................... 73/865.9; 438/14; 414/935; 73/865.8
(58) Field of Search ........................ 73/865.9, 865.8, 73/179; 414/935, 217.1; 438/14; 279/126

(56) References Cited

U.S. PATENT DOCUMENTS 5,946,184 A * 8/1999 Kanno et al. ................ 361/234
6,499,367 B1 * 12/2002 Saeki ........................ 73/865.9
2002/0114684 A1 * 8/2002 Jeong et al. ............. 414/217.1

FOREIGN PATENT DOCUMENTS

JP 11195694 A * 7/1999 ........... H01L/21/68
JP 00156400 A * 6/2000

* cited by examiner

Primary Examiner—Hezron Williams
Assistant Examiner—Nashmiya Fayyaz
(74) Attorney, Agent, or Firm—Tung & Associates

(57) ABSTRACT

An apparatus and method for detecting in chamber wafer position and process status are disclosed. A chamber includes a processing pedestal and plurality of lift pins. Each lift pin has an associated load cell for measuring the load exerted by the wafer on the lift pins. Mispositioned wafers or broken wafers will result in load measurements outside of expected ranges. Position of the wafer may be determined from the load distribution sensed on the lift pins.

4 Claims, 3 Drawing Sheets

CHAMBER WAFER DETECTION

TECHNICAL FIELD

The present invention is generally related to microchip fabrication. More particularly, the invention relates to process controls and equipment related to certain chamber dependant fabrication steps.

BACKGROUND OF THE INVENTION

In microchip fabrication, processing chambers are used in accomplishing various fabrication steps performed on a wafer. For example, among the numerous varieties of steps are the non-exhaustive examples of annealing, cleaning, chemical vapor deposition, oxidation, and nitridation.

Chambers generally comprise a substantially planar and horizontal pedestal upon which the wafer rests during the processing within the chamber. The pedestal may also be known as a platen, stage or susceptor. A lift mechanism comprising pins which breach the pedestal from underneath provides a controlled disengagement from, and engagement of the wafer to, the pedestal surface. Wafers are transferred into and out of the chamber, and onto and off of the lift mechanism pins, by way of a robotic mechanism including a robot blade or fork at the end of a robotic arm.

Retention of the wafer to the pedestal while in the chamber is referred to as chucking. Chucking may be accomplished mechanically such as by clamping at the periphery or by a vacuum holding force. Commonly, retention of the wafer to the pedestal is accomplished electrostatically by an electrostatic chuck.

Wafers tend to be relatively brittle and susceptible to damage anytime one is handled or manipulated. For example, late release of a mechanical chuck or residual charge in an electrostatic chucking mechanism may result in damaged wafers if the pins attempt to separate the wafer from the pedestal prior to its complete release therefrom. If the retention force is great enough the wafer may break before release. The wafer may also break if it releases with a spring action and bounces. A wafer may also become mispositioned with respect to the pins during such a release. A wafer may also become mispositioned with respect to the pins when engagement therewith is undesirably harsh. A wafer mispositioned with respect to the pins will also be mispositioned when it is brought into contact with the pedestal. Apart from late or incomplete release of the wafer from the pedestal, contact of the pins with the wafer may be undesirably harsh during unimpeded separation of the wafer from the pedestal thus damaging the wafer. A wafer may also become mispositioned with respect to the pins during such a harsh contacting. Pin travel during separation of the wafer from the pedestal in preparation for transfer to the robot blade may reach the travel limit undesirably abruptly resulting in breakage of the wafer or mispositioning upon the pins as the wafer bounces upon the pins. Mispositioning upon the pins may result in mispositioning upon the robot blade which may in turn result in damage of the wafer as it is removed from the chamber through the slit valve or access slot or thereafter in a subsequent transfer from the robot blade. Mispositioning upon the pins wherein the wafer is partially supported by the pins and the pedestal might also result in damage or breakage of the wafer when the robot blade enters the chamber to retrieve the wafer.

An operator may never be alerted to the various situations outlined above in a conventionally automated process resulting in wasteful utilization of chamber processing time on a broken or damaged wafer or on a wafer that is mispositioned on the pedestal. A wafer broken upon its loading into the chamber would desirably not be processed. Unbroken but mispositioned wafers may be subject to much lower yields due to edge effects, for example, in a sputtering process that could be avoided if the wafer were removed from the chamber and properly loaded. A wafer that is broken into several pieces, whether broken pre or post chamber processing, might not be removed from the chamber at all thus resulting in wafer debris within the chamber during further attempted wafer processing.

SUMMARY OF THE INVENTION

Therefore, it is one object of the present invention to provide for an apparatus and method used for detecting a variety of wafer process conditions including wafer position, wafer breakage and wafer chucking.

It is a further object of the present invention to provide for an apparatus and method used for detecting a variety of wafer process conditions which requires minimal modifications to general purpose semiconductor fabrication processing chambers.

It is a further object of the present invention to sense wafer position by detecting the load impressed at each of the lift pins of a general purpose semiconductor fabrication processing chambers by a wafer residing thereon.

These objects and advantages of the present invention are realized in a process chamber lift pin mechanism adapted to sense loads upon each lift pin. Determination of wafer position is accomplished from the sensed loads. Such mechanism is adapted to detect wafer position, wafer breakage and incomplete dechucking of the wafer. Preferably, the lift pins number three and are distributed in an equilateral triangular pattern. Proper wafer positioning is assumed to be correspondence of the wafer geometric center with the center of the lift pin pattern. Load cells are associated with each lift pin and provide a measure of the load at each lift pin. Load magnitudes and load distribution among the pins are used to detect such process conditions as wafer position, wafer breakage and wafer chucking.

BRIEF DESCRIPTION OF THE DRAWINGS

The present invention will now be described, by way of example, with reference to the accompanying drawings, in which.

DESCRIPTION OF THE PREFERRED EMBODIMENT

Figure 1:
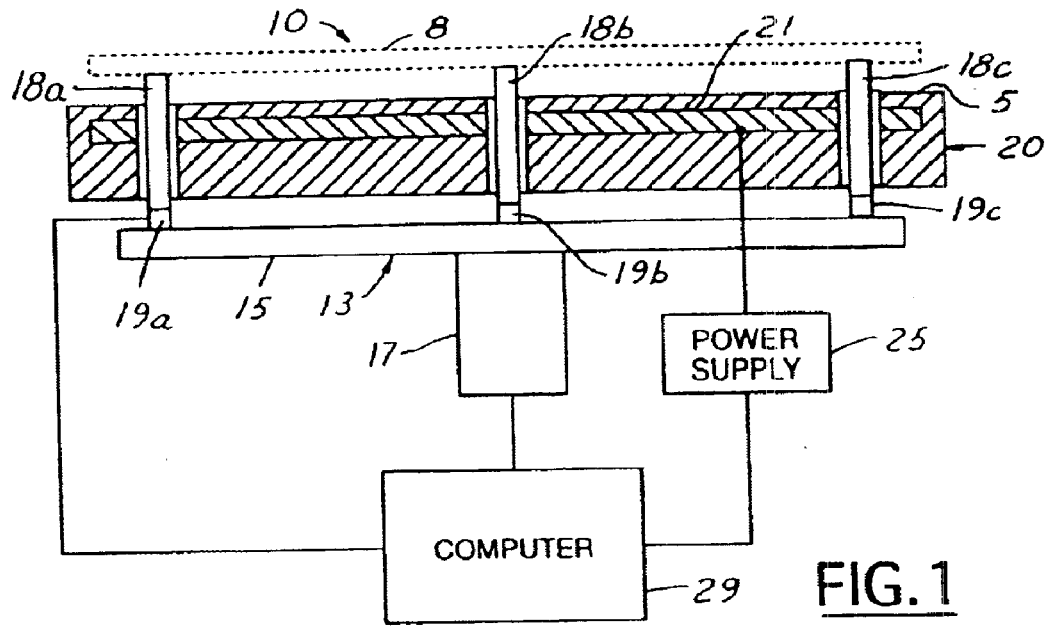
FIG. 1 is a schematic partial sectional representation of a general purpose semiconductor fabrication processing chamber including lift pin mechanism in accordance with a preferred embodiment of the present invention.

With reference first to FIG. 1, numeral 10 refers to portions of a general purpose semiconductor fabrication processing chamber shown as a partial sectional schematic. Pedestal 20 has an embedded electrode 21 and provides a support surface 5 for wafer 8 during processing thereof. Wafer 8 is shown in phantom for clarity from the remaining portions of FIG. 1. Electrode 21 is charge conductive and provides, in conjunction with application of voltage from power supply 25, electrostatic retention forces upon wafer 8. While an electrostatic chuck is illustrated in FIG. 1, other chucking mechanizations and implementations may be utilized without departing from the present invention.

Lift pin mechanism 13 includes base 15 which carries a plurality of lift pins 18a, 18b, and 8c. At least, and preferably, three such lift pins 18 are provided though more may be implemented in accordance with the present invention. Each lift pin 18 breaches the pedestal 20 unimpeded. Lift pin mechanism 13 is controlled between lift and lower positions and modes. In lift mode the lift pin mechanism 13 is controlled to an extended position wherein the lift pins 18 extend above the surface 5 of pedestal 20. In the retracted mode the lift pin mechanism 13 is controlled to a retracted position wherein the lift pins 18 are recessed below the surface 5 of pedestal 20. Lift pin mechanism 13 is extended and retracted such as by pneumatic means 17 or any wide range of equivalent means including motors, servos, hydraulics, etc.

In conventional operation, a water is transferred into the chamber through a slot valve (not shown) in the sidewall of the chamber by way of a fork or blade of a robotic transfer. Cantilevered wafer transfer mechanisms, vacuum transfer mechanisms and other mechanisms not mentioned may be utilized in the transfer of wafers to the processing chamber. The wafer is placed upon the set of extended lift pins 18. The lift mechanism is then retracted and the wafer placed in proximity to and supported at its backside by surface 5 of pedestal 20.

Computer 29 may take the form of any properly configured general purpose computer, fabrication enterprise controller, or other programmable controller designed or capable of being adapted for implementing the control and sensing functions to be described. It is shown in the present exemplary embodiment being interfaced with power supply 25 and pneumatic means 17 for monitoring and controlling the operation of each of these systems. Computer 29 may include such conventional elements as a central processing unit (CPU), read only memory (ROM) (including removable media drive and mass storage drives such as a hard drive), random access memory (RAM), clock, input/output (I/O) circuitry including buffering and conditioning circuitry including A/D and D/A converters.

In addition to the previously describe conventional components, sensors 19a, 19b, 19c comprising individual load cells are associated with the apparatus. While only one of the sensors is actually illustrated as interfaced with the computer 29, each sensor is interfaced with computer 29 such that the sensors' outputs may be monitored and possibly controlled or conditioned as required. The load cells 19 are configured to sense and respond to load or force that is along the major axis of the lift pins. Each sensor 19 is located preferably between the base 15 and each respective lift pin 18. An exemplary embodiment of a sensor, base and lift pin configuration is described later with respect to FIG. 3.

Figure 2:
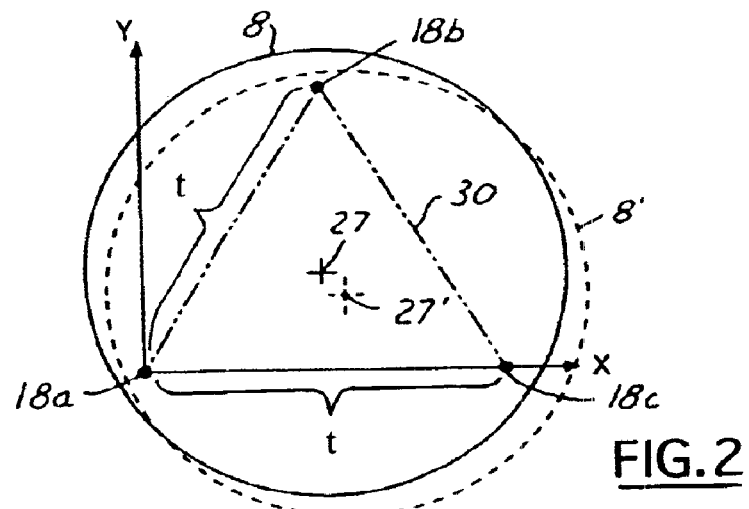
FIG. 2 is a plan view of properly and improperly located wafers residing on top of the lift pins of a chamber as shown in FIG. 1 in accordance with a preferred embodiment of the present invention.

With additional reference to FIG. 2, the exemplary apparatus as shown in FIG. 1 is shown, in part, in plan view. If one could see through the wafer 8, the preferred arrangement of the three lift pins 18 would appear in the location of the solid large dots. Each of the pins 18 is distributed to a different apex of an equilateral triangle 30. The center of wafer 8 is designated by the solid crosshair (+) 27 and designates not only the geometric center but also the center of gravity of the wafer 8. Wafer 8 is shown in a properly oriented position or place t wherein the wafer 8 is placed central or symmetrical to the lift in layout. An out of position or mispositioned wafer is illustrated in phantom and labeled 8'. Similar center marking is designated by the dashed crosshair (+) 27'.

Overlayed for illustration are the X and Y axes of Cartesian coordinate system shown as bold arrowed lines but not otherwise separately labeled other than by the adjacent X and Y designations. The origin (0,0) of the coordinate system is selected to coincide with one of the lift pins 18. Furthermore, the X axis is arranged to be collinear with one leg of the equilateral triangle 30. That is to say the X axis is coincident with one of the lift pins at the origin and with another of the lift pins being coincident with the X axis away from the origin.

A wafer that is positioned upon a set of lift pins will exert a force upon each of the lift pins that it is in contact with. On a triangular patterned layout of lift pins, each of the lift pins will support a portion of the entire mass of the wafer. If the wafers are substantially uniform in their effective density or mass distribution then the mass distribution upon the lift pins of a regularly and repeatably placed wafer is similarly regular and repeatable and it is expected that such an arrangement would yield predictable mass, force or load measurements if so measured, such as by the exemplary sensors.

In the present preferred arrangement, the lift pins are distributed in an equilateral triangle pattern. Each of the lift pins is therefore an equivalent distance t from the other two lift pins, i.e. the distance t between 18a and 18b is equivalent to the distance t between 18a and 18c, and is equivalent to the distance t between 18b and 18c. A properly placed wafer is one that is centrally located upon the lift pins so arranged. The geometric center of the round wafer is aligned with the geometric center of the three lift pins. The geometric center of the round wafer also corresponds to the center of gravity thereto. In such a preferred arrangement it is expect that the load seen by the sensors will be equivalent. Deviation from equivalency suggests reliably that the wafer is mispositioned. The precise position of the wafer can be determined from the known lay of the lift pins and the known center of gravity of the wafer.

Using the preferred layout of lift pins as described with respect to an equilateral triangle, the following mathematical expressions derived from the geometry of the equilateral triangle layout of the lift pins with a Cartesian coordinate system as set forth in the description of FIG. 2 may be utilized to simply and predictably determine the wafer position with respect to the location of its center of gravity relative to the coordinate system. Other coordinate systems, for example a polar coordinate system, may be equally adaptable for the present invention.

$$x = \frac{M_1 \times 0.5t + M_3 \times t}{M_1 + M_2 + M_3}$$

$$y = \frac{(\sqrt{3}/2) \times t \times M_1}{M_1 + M_2 + M_3}$$

Where t=an equivalent distance from one of the plurality of lift pins (18a, 28b, or 18c) to the other two lift pins, i.e. the distance t from pin 18a to pin 18b is equivalent to the distance from pin 18a to pin 18c, and is equivalent to the distance from 18b to 18c, M1=load at lift pin 18b, M2=load at lift pin 18a, and M3=load at lift pin 18c.

Figure 3:
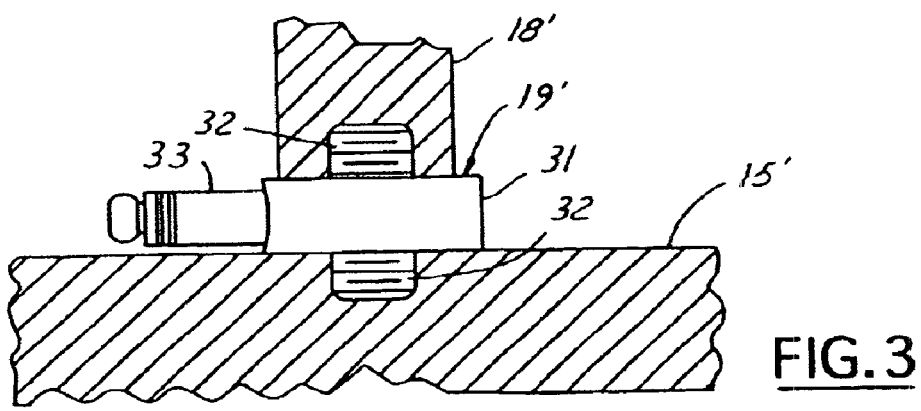
FIG. 3 is a detailed schematic partial sectional view of a preferred lift pin mechanism in accordance with the present invention.

FIG. 3. illustrates an exemplary arrangement for a lift pin mechanism suitable to carry out the load sensing aspects of the present invention. Lift pin 18' is coupled at the end proximate to the base 15' to load sensor 19' and sensor 19' is coupled to the base 15' such that sensor is located between the lift pin 18' and base 15'. Load sensor 19' is of a known variety of miniature or sub-miniature ring style load cells having an hermetic package 31 of stainless steel or similar material which houses a piezoelectric crystal. Mounting studs 32 are located on opposite sides of the package and serve to attach the package to the lift pin 18' and base 15'. The studs 32 also allow for the preloading of the sensor package as is known to be desirable. Output 33 from package 31 may be conditioned or unconditioned. Preferably, the output 33 is a conditioned output which requires internal microcircuit conventionally used to convert the charge generated by the piezoelectric element into a low impedance voltage signal, provide amplification or attenuation, and filtering as required. Such sensors are typically referred to as voltage mode sensors whereas sensors without such conditioning are referred to as charge mode sensors. Voltage mode sensors are preferred for many reasons, among which are relative immunity to such influences as cable movement, electromagnetic and radio frequency interference, and compatibility with conventional I/O interfaces.

Figure 4:
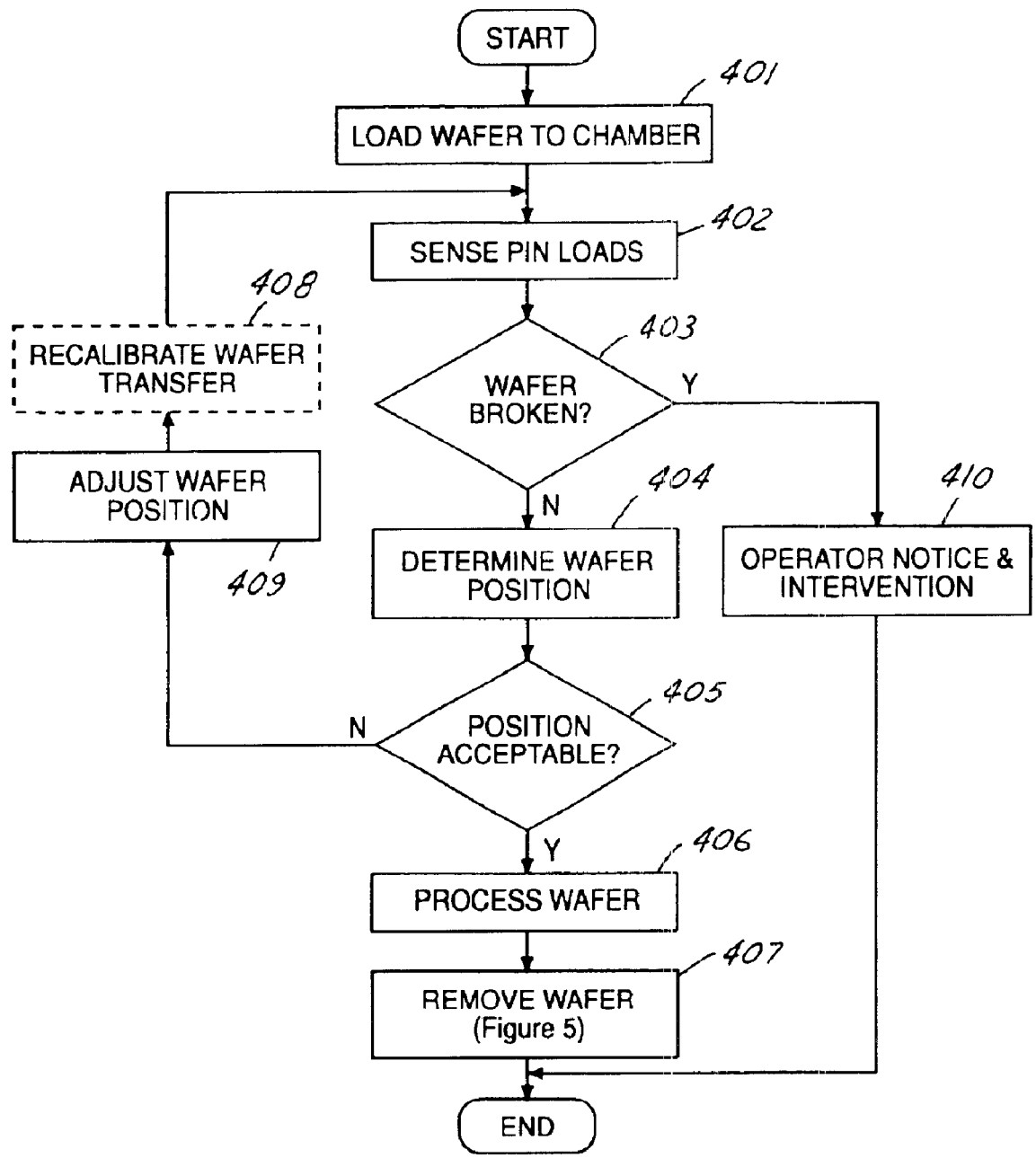
FIG. 4 is a representation of various steps carried out in practicing the apparatus of the present invention and various wafer loading related method steps of the present invention; and, FIG. 5 is a representation of various steps carried out in practicing the apparatus of the present invention and various wafer removal related method steps of the present invention.

In a preferred implementation and practice, computer 29 (FIG. 1) executes certain instruction sets related to process control, sensor measurements, and calculations. Preferably, the instruction sets to be described with respect to the present invention are part of a much larger set of instructions executed as part of the general process controls. FIG. 4 generally sets forth steps related to a variety of functions corresponding to wafer loading prior to processing whereas FIG. 5 generally sets forth steps related to a variety of functions corresponding to wafer removal subsequent to processing.

First with reference to step 401 of FIG. 4, a wafer is robotically loaded into the processing chamber through a slit valve in the sidewall thereof. The wafer is transferred onto the lift pins from the robot blade. The load sensors are monitored or read at step 402. A determination is next made at step 403 whether the wafer is broken. No load being sensed at the lift pins would indicate this. A broken wafer would set an alarm and preferably suspend operation as indicated by step 410. The routine would terminate at that point with appropriate flags set to prevent continued execution of any routine to which the present routine would return. Alternatively, an intact wafer would pass to step 404 whereat determination is made as to wafer position such as by the mathematical expressions previously described. An unacceptable position would be detected by step 405 and a negative response thereat. Remedial action may then be taken as shown in step 409 whereat the wafer position would be adjusted, preferably in automated fashion by provision of the relevant position data to the robotic transfer mechanism. Step 408 may optionally be implemented to cause the recalibration of the robotic transfer mechanism. Such may be desirable in the event that analysis of multiple wafer transfers indicates that the wafer transfers statistically indicate a need for adjustment. Such adjustments may be accomplished through software adjustments or trimming in many cases until appropriate mechanical adjustments can be made such as at scheduled maintenance intervals. This process is repeated beginning at step 402 until an acceptable position is achieved. An acceptable position on the other hand passes control to step 406 which indicates the general execution of the present substantive process control to take place in the chamber including retraction of the lift pins and chucking of the wafer to the pedestal. Step 407 next represents steps to remove the wafer subsequent to processing as detailed in FIG. 5.

Figure 5:
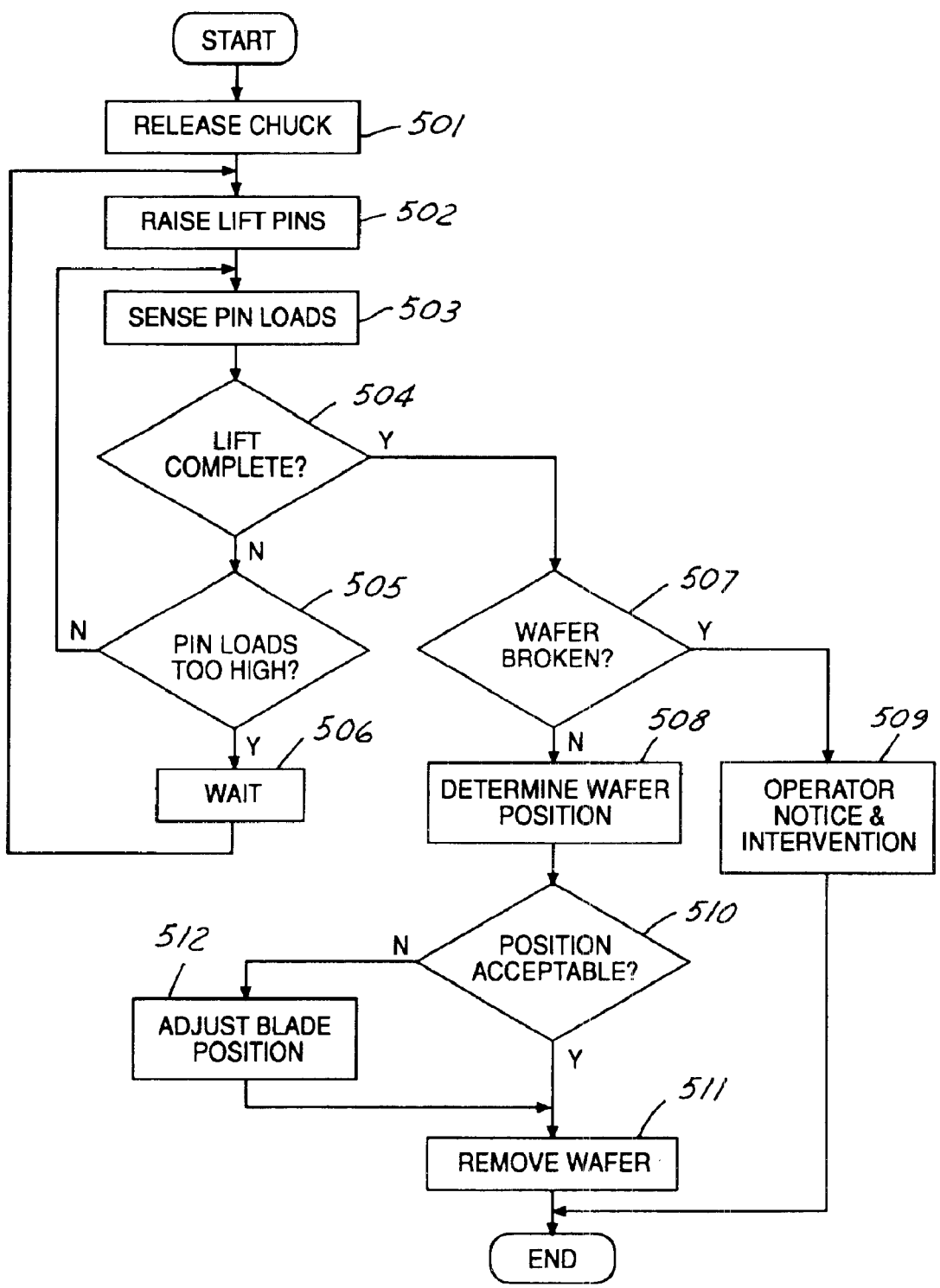

With reference to FIG. 5 the set of exemplary steps for wafer removal subsequent to processing is illustrated. At step 501 a chuck release is commanded. Next at step 502 the lift pins are commanded to rise to separate the wafer from the pedestal. Lift pin loads are monitored at step 503. At step 504 if the lift pins are not completely extended then the lift is determined to be incomplete and lift pin loads can next be checked at step 505. Step 505 determines from the monitored loads and predetermine limits whether the loads are excessive. Excessive loads indicate an incomplete dechucking and potential for wafer damage if continued increases of lift pin force is encountered. Step 506 represents remedial process action in the event of lift pin loads being excessive. Incomplete dechucking may merely require a wait state as indicated for charge to dissipate from the chuck and retention force to follow similarly. Other remedial steps may be taken including recommending a dechucking, lowering or relaxing of the lift pin positions or operator interventions. For the present example it is assumed that a wait will rectify the incomplete dechucking and control subsequent to the wait is passed back to step 502. Where pin loads are indicated as not being too high at step 505, control is looped back to step 503. Lift pin completion as indicated by an affirmative response at step 504 causes execution of a determination of whether the wafer is broken. As previous described, a broken wafer would be indicated by no load being sensed at the lift pins. A broken wafer would set an alarm and preferably suspend operation as indicated by step 509. The routine would terminate at that point with appropriate flags set to prevent continued execution of any routine to which the present routine would return. Alternatively, an intact wafer would pass to step 50 whereat wafer position is determined. A mispositioned wafer at this step may indicate that the release was too harsh and the wafer popped off of the pedestal or was not released smoothly. An acceptable position of the wafer as determined at step 510 would result in control being passed to step 511 whereat wafer removal steps including robotic transfer is controlled. An unacceptable position of the wafer as determined at step 510 would result in control being passed to step 512 whereat the positional information is communicated to the robotic transfer mechanism such that adjustments in the blade positioning can be made to account for the mispositioning. Control would then pass to step 511 whereat wafer removal steps including robotic transfer are controlled.

The invention has been described with respect to certain preferred embodiments to be taken by way of example and not by way of limitation. Certain alternative implementations and modifications may be apparent to one exercising ordinary skill in the art. Therefore, the scope of invention as disclosed herein is to be limited only with respect to the appended claims.

The invention in which an exclusive property or privilege is claimed are defined as follows:

1. Method of detecting a position status of a wafer in a wafer chamber, said chamber including a plurality of lift pins for supporting the wafer, the method comprising the steps:

sensing respective loads exerted by the wafer upon each of the plurality of lift pins, wherein the plurality of pins numbers three distributed at the apexes of an equilateral triangle; and determining from said respective loads a position status of the wafer wherein said step of determining the position status of the wafer includes the step of determining whether the wafer is acceptably positioned, wherein the wafer is determined to be unacceptably positioned when the respective loads exerted by the water upon each of the plurality of lift pins are not substantially equivalent, and determining the location of the wafer by performing the step of calculating the location of the wafer from the distribution of the respective loads exerted by the wafer upon each of the plurality of lift pins, wherein the location of the wafer is defined by a coordinate pair location (x,y) of the wafer geometric center on a Cartesian coordinate system wherein a first one of the three pins corresponds to the coordinate system origin, a line internecting the origin and a second one of the three pins corresponds to an X-axis of the coordinate system, a line intersecting the origin perpendicular to the X-axis corresponds to the Y-axis of the coordinate system, wherein $$x = \frac{M_1 \times 0.5t + M_3 \times t}{M_1 + M_2 + M_3}$$

$$y = \frac{(\sqrt{3}/2) \times t \times M_1}{M_1 + M_2 + M_3}$$

t-an equivalent distance from any one of the three lift pins to the other two lift pins, M1-load at a third one of the three pins, M2-load at the first one of the three pins, and M3-load at the second one of the three pins.

2. The method as claimed in claim 1 wherein said step of sensing respective loads includes sensing said respective loads with piezoelectric load cells.

3. The method as claimed in claim 1 wherein said step of determining the position status of the wafer includes determining whether the wafer is acceptably positioned.

4. The method as claimed in claim 3 wherein the wafer is determined to be unacceptably positioned when at least one of the respective loads exerted by the wafer upon the corresponding one of the plurality of predetermined load substantially equivalent to a respective predetermined load.

* * * * *